US008704428B2

(12) United States Patent
Yun et al.

(10) Patent No.: US 8,704,428 B2
(45) Date of Patent: Apr. 22, 2014

(54) WIDENING RESONATOR BANDWIDTH USING MECHANICAL LOADING

(75) Inventors: Changhan Hobie Yun, San Diego, CA (US); Chengjie Zuo, Santee, CA (US); Chi Shun Lo, San Diego, CA (US); Sanghoon Joo, Sunnyvale, CA (US); Jonghae Kim, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 322 days.

(21) Appl. No.: 13/090,790

(22) Filed: Apr. 20, 2011

(65) Prior Publication Data

US 2012/0268440 A1     Oct. 25, 2012

(51) Int. Cl.
*H03H 9/17*   (2006.01)
(52) U.S. Cl.
USPC ........... 310/348; 310/339; 310/344; 310/351; 310/352
(58) Field of Classification Search
USPC .......................... 310/348, 344, 351, 352, 339
See application file for complete search history.

(56) References Cited

U.S. PATENT DOCUMENTS

| | | | |
|---|---|---|---|
| 6,127,771 A * | 10/2000 | Boyd et al. | 310/359 |
| 6,236,145 B1 | 5/2001 | Biernacki | |
| 7,002,436 B2 | 2/2006 | Ma et al. | |
| 7,342,351 B2 * | 3/2008 | Kubo et al. | 310/344 |
| 7,701,111 B2 * | 4/2010 | Pletner et al. | 310/311 |
| 7,750,759 B1 | 7/2010 | Lee et al. | |
| 2003/0030118 A1 | 2/2003 | Kim | |
| 2005/0269902 A1 * | 12/2005 | Thiesen | 310/313 R |
| 2007/0188054 A1 * | 8/2007 | Hasken et al. | 310/348 |
| 2007/0252485 A1 * | 11/2007 | Kawakubo et al. | 310/365 |
| 2009/0256449 A1 * | 10/2009 | Nishimura et al. | 310/348 |
| 2009/0315644 A1 | 12/2009 | Sheedy et al. | |
| 2010/0039696 A1 * | 2/2010 | de Groot et al. | 359/291 |
| 2010/0053922 A1 | 3/2010 | Ebefors et al. | |
| 2010/0060111 A1 * | 3/2010 | Ayazi et al. | 310/367 |
| 2010/0123369 A1 * | 5/2010 | Ono et al. | 310/348 |

FOREIGN PATENT DOCUMENTS

| | | |
|---|---|---|
| WO | WO2006130777 A2 | 12/2006 |
| WO | WO2009000815 A1 | 12/2008 |
| WO | WO2010077313 A1 | 7/2010 |
| WO | WO2010138243 A1 | 12/2010 |

OTHER PUBLICATIONS

Clark J R et al: "UHF high-order radial-contour-mode disk resonators 11", Proceedings of the 2003 IEEE International Frequency Control Symposium & PDA Exhibition Jointly With the 17th. European Frequency and Time Forum. Tampa. FL. May 4-B. 2003; [IEEE International Frequency Control Symposium]. New York. NY: IEEE. US. May 4, 2003. pp. 802-809. XP010688961.
International Search Report and Written Opinion—PCT/US2012/033906—ISA/EPO—Jul. 17, 2012.
P. J. Stephanou, et al., "Mechanically Coupled Contour Mode Piezoelectric Aluminum Nitride MEMS Filters", MEMS 2006, Istanbul Turkey, Jan. 22-26, 2006, 4 pages.

* cited by examiner

*Primary Examiner* — Thomas Dougherty
*Assistant Examiner* — Bryan Gordon
(74) *Attorney, Agent, or Firm* — Knobbe Martens Olson & Bear LLP

(57) ABSTRACT

This disclosure provides systems, apparatus and techniques by which electromechanical resonators are implemented. In one aspect, by mechanically loading the resonator body in specific ways, multiple resonance modes are created within the resonator body resulting in wider bandwidths.

18 Claims, 6 Drawing Sheets

WIDENING RESONATOR BANDWIDTH USING MECHANICAL LOADING

TECHNICAL FIELD

This disclosure relates to electromechanical resonators and, in particular, to techniques for widening resonator bandwidths.

DESCRIPTION OF THE RELATED TECHNOLOGY

Electromechanical systems include devices having electrical and mechanical elements, actuators, transducers, sensors, optical components (e.g., mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In some implementations, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

In addition to electromechanical systems devices such as IMODs, a variety of electronic components and circuits may be implemented at the electromechanical systems level including, for example, electromechanical systems filters. However, conventional electromechanical systems filters have limitations. For example, conventional surface acoustic wave (SAW) filters are often bulky and must be located off-chip. This is undesirable for modern wireless communications systems which typically specify miniaturized, low-cost, low-power, low-impedance, on-chip and high quality (Q) resonators to be employed in front-end radio frequency (RF) filters or as frequency references.

An electromechanical resonator is a device that exhibits resonance in a band around a center frequency. The quality factor or Q factor characterizes the resonator's bandwidth relative to its center frequency. The higher the Q factor, the narrower the resonator bandwidth. In some applications, e.g., filter applications, it may be desirable to reduce a resonator's Q factor to achieve a wider bandwidth; also known as de-Q'ing. This is often done by adding external inductors, i.e., inductive matching. However, such external components are often undesirably large relative to the resonator itself, and are not compatible with many of the products and systems with which resonators are employed.

SUMMARY

The systems, methods and devices of the disclosure each have several innovative aspects, no single one of which is solely responsible for the desirable attributes disclosed herein.

One innovative aspect of the subject matter described in this disclosure can be implemented in an electromechanical resonator includes a resonator cavity defined by a substrate, side walls, and a sealing element. A resonator body is disposed within the resonator cavity substantially parallel to the substrate and the sealing element, the resonator body having a plurality of electrodes disposed thereon. One or more mechanical loading elements mechanically connect the resonator body to either or both of the substrate or the sealing element. The one or more mechanical loading elements mechanically loads the resonator body to create a plurality of in-plane resonance modes within the resonator body.

Another innovative aspect of the subject matter described in this disclosure can be implemented in an electromechanical resonator includes a resonator cavity defined by a substrate, side walls, and a sealing element. A resonator body is disposed within the resonator cavity substantially parallel to the substrate and the sealing element. The resonator body has an input electrode and an output electrode disposed thereon. A mechanical loading element mechanically connects the resonator body to the substrate. The mechanical loading element may be an elongated member disposed along a longitudinal axis of the resonator body and substantially along a center line of a surface of the resonator body. The mechanical loading element mechanically loads the resonator body to create two in-plane resonance modes within the resonator body.

Yet another innovative aspect of the subject matter described in this disclosure can be implemented in an electromechanical resonator includes a resonator cavity defined by a substrate, side walls, and a transparent sealing element. A resonator body is disposed within the resonator cavity substantially parallel to the substrate and the sealing element. The resonator body has an input electrode and an output electrode disposed thereon. A transparent mechanical loading element mechanically connects the resonator body to the sealing element. The mechanical loading element may be an elongated member disposed along a longitudinal axis of the resonator body and substantially along a center line of a surface of the resonator body. The mechanical loading element mechanically loads the resonator body to create two in-plane resonance modes within the resonator body.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 1(*b*) shows an example of a cross-sectional view of the resonator of FIG. 1(*a*).

Like reference numbers and designations in the various drawings indicate like elements.

DETAILED DESCRIPTION

Figure 1:
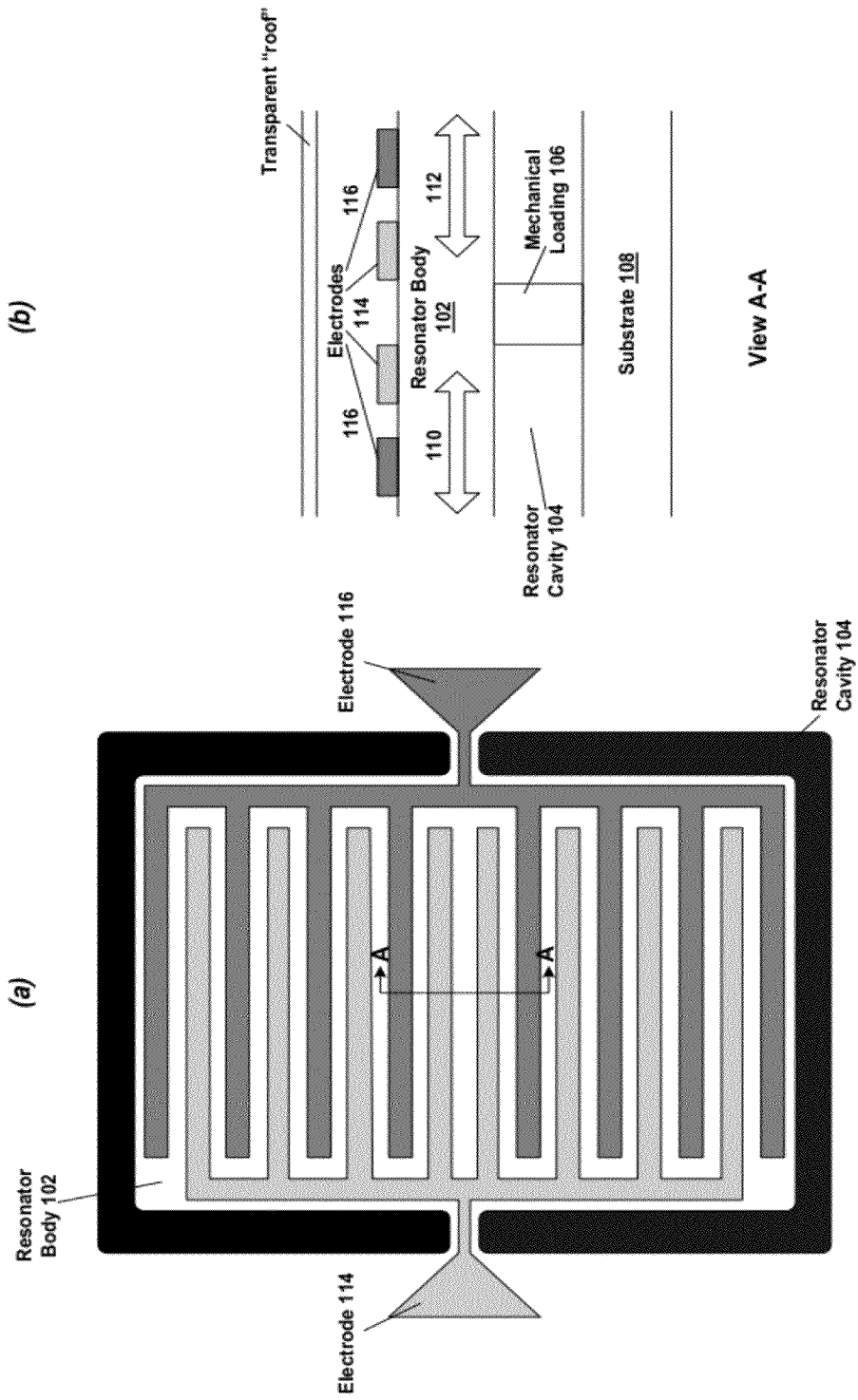
FIG. 1(*a*) shows an example of a top view of a resonator.

The following detailed description is directed to certain implementations for the purposes of describing the innovative aspects. However, the teachings herein can be applied in a multitude of different ways. The described implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., electromechanical systems (EMS), MEMS and non-MEMS), aesthetic structures (e.g., display of images on a piece of jewelry) and a variety of electromechanical systems devices. Further applications include, but are not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the Figures, but instead have wide applicability as will be readily apparent to those of ordinary skill in the art.

Disclosed are examples of structures and configurations of electromechanical resonators. Resonators constructed as described herein may be incorporated into any of the wide variety of devices and systems described in the preceding paragraph. At least some of these resonators are referred to as "contour mode resonators" or CMRs because of their lateral or in-plane modes of vibration. At a particular input frequency or frequencies, a CMR resonator body exhibits mechanical resonance. Electrical energy at such frequencies is provided to an input electrode of the CMR and transferred to mechanical energy in the form of movement of a resonator body constructed of piezoelectric material in contact with the input electrode along one or more planes in which the resonator body is oriented. The rate of piezoelectric vibration is generally referred to as the resonant frequency of the CMR. The mechanical energy is transferred back to electrical energy at an output electrode in contact with the resonator body. Contour mode (d31) resonators are to be distinguished from thickness/extensional mode (d33) resonators in which the primary mode of mechanical vibration is perpendicular to the primary plane of the resonator body.

CMRs disclosed herein can serve as building blocks for a wide variety of devices and systems such as, for example, wireless communication circuits and components such as filters, oscillators, and frequency reference sources, and can be incorporated in various devices such as, for example, receivers, transmitters, transceivers, or duplexers.

Various implementations achieve de-Q'ing of electromechanical resonators by using various alternative mechanical loading configurations that mechanically load the resonator body such that multiple resonance modes are created within a single resonator body. FIG. 1(a) shows an example of a top view of a resonator. FIG. 1(b) shows an example of a cross-sectional view of the resonator of FIG. 1(a). FIG. 1(a) is a top view of a resonator body 102 in a resonator cavity 104 through a transparent "roof" (not shown in FIG. 1(a)) also referred to as a cap or micro-electromechanical system (MEMS) sealing element. As shown in the cross-sectional A-A view of FIG. 1(b), the resonator body 102 is mechanically connected (via mechanical loading element 106) to the substrate or floor 108 of the resonator cavity 104 rather than tethered to the side walls as is typical of many CMR designs. In the illustrated implementation, loading element 106 is an elongated support member that extends along the center line of the underside of resonator body 102, i.e., into the page in FIG. 1(b), and substantially parallel with the "fingers" of electrodes 114 and 116. This vertical connection (as opposed to conventional in-plane connection to the cavity walls) mechanically loads the degrees of freedom of the resonator body in such a way that multiple, substantially independent resonance modes exist in a single resonator body as illustrated by arrows 110 and 112.

The mechanical loading of the resonator body as described herein is to be contrasted with conventional resonator designs for which the primary goal is to preserve a single resonance mode with the greatest fidelity possible. This is typically achieved, for example, by connecting mechanical tether and anchor elements to the resonator body at the zero crossings of the resonator body's primary resonance mode. By contrast, implementations described herein connect mechanical elements to the resonator body in such a way as to mechanically load the resonator body, and thereby widen the bandwidth of the resonance mode in the frequency domain. And it should be noted that the material from which mechanical loading element 106 is constructed may or may not be the same material from which resonator body 102 is constructed and, more generally, may vary considerably for different implementations.

In accordance with specific implementations, vertical loading (e.g., by tethering and/or anchoring) is effective because the z (vertical) displacement of the resonator body is large (regardless of the FBAR thickness mode or the CMR lateral mode) because the electric field of actuation is applied in the z direction. For example, for AlN, the z displacement is about 3x larger than the lateral displacement for the same electric field. Due to the volume conservation of the material (AlN or other piezoelectric material), if the z-direction motion is impeded, the other (i.e., lateral) direction motion also impeded.

Figure 2:
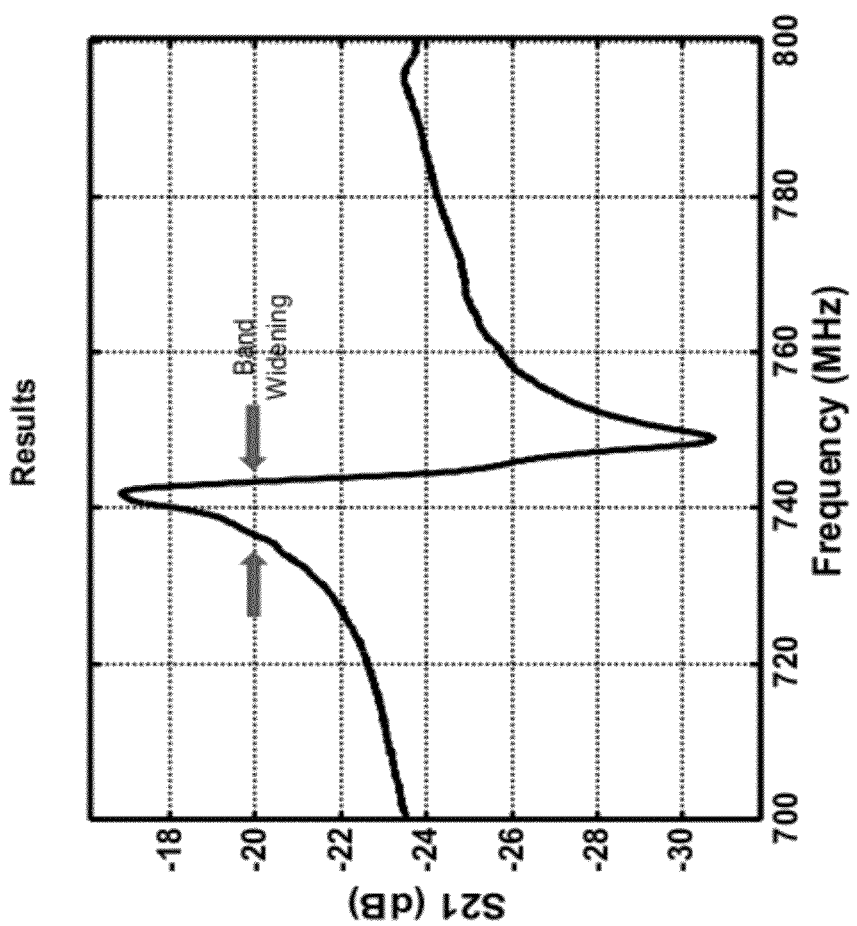
FIG. 2 shows an example of a graph illustrating the bandwidth widening associated with the resonator of FIGS. 1(a) and 1(b).

The CMR of FIGS. 1(a) and 1(b) includes a pattern of metal electrodes 114 and 116 on the upper surface of resonator body 102 that, when provided stimulus in the form of one or more electrical input signals, cause the piezoelectric material to have a motional response. The motional response includes vibrational oscillations along an axis perpendicular to the thickness of the device (e.g., as represented by arrows 110 and 112). Moreover, electrodes 114 and 116 are configured such that the appropriate application of input signals may result in both in-phase and out-of-phase interaction of these multiple resonance modes. FIG. 2 shows an example of a graph illustrating the bandwidth widening associated with the resonator of FIGS. 1(a) and 1(b).

The frequency responses of the multiple resonance modes of the CMR structures implemented as described herein can be controlled by the arrangement of the electrodes on the resonator body, for instance, by adjusting the spacing of electrodes. The frequency of resonance is proportional to 1 over the period of either the input electrode or the output electrode, and is related to the speed of elastic wave propagation in the piezoelectric material. For example, an electrode period of 10 microns corresponds to a resonant frequency of approximately 1 GHz when the piezoelectric material is made of aluminum nitride.

Piezoelectric materials that can be used in fabrication of resonators as described herein, for example, aluminum nitride, zinc oxide, gallium arsenide, aluminum gallium arsenide, gallium nitride, quartz and other piezoelectric materials such as zinc-sulfide, cadmium-sulfide, lithium tantalate, lithium niobate, lead zirconate titanate, members of the lead lanthanum zirconate titanate family, and combinations thereof. The electrodes on the resonator body may be made of various conductive materials including platinum, aluminum, molybdenum, tungsten, titanium, niobium, ruthenium, chromium, doped polycrystalline silicon, doped AlGaAs compounds, gold, copper, silver, tantalum, cobalt, nickel, palladium, silicon germanium, doped conductive zinc oxide, and combinations thereof. In various implementations, the input and output electrodes can include the same conductive material(s) or different conductive materials.

Details of techniques for fabricating electromechanical systems CMRs, suitable variations of which can be used to build devices as described herein, are disclosed in U.S. Patent Publication No. 2006/0290449, titled "Contour-Mode Piezoelectric Micromechanical Resonators," by Piazza et al., filed May 31, 2006, the entire disclosure of which is hereby incorporated by reference for all purposes.

Figure 3:
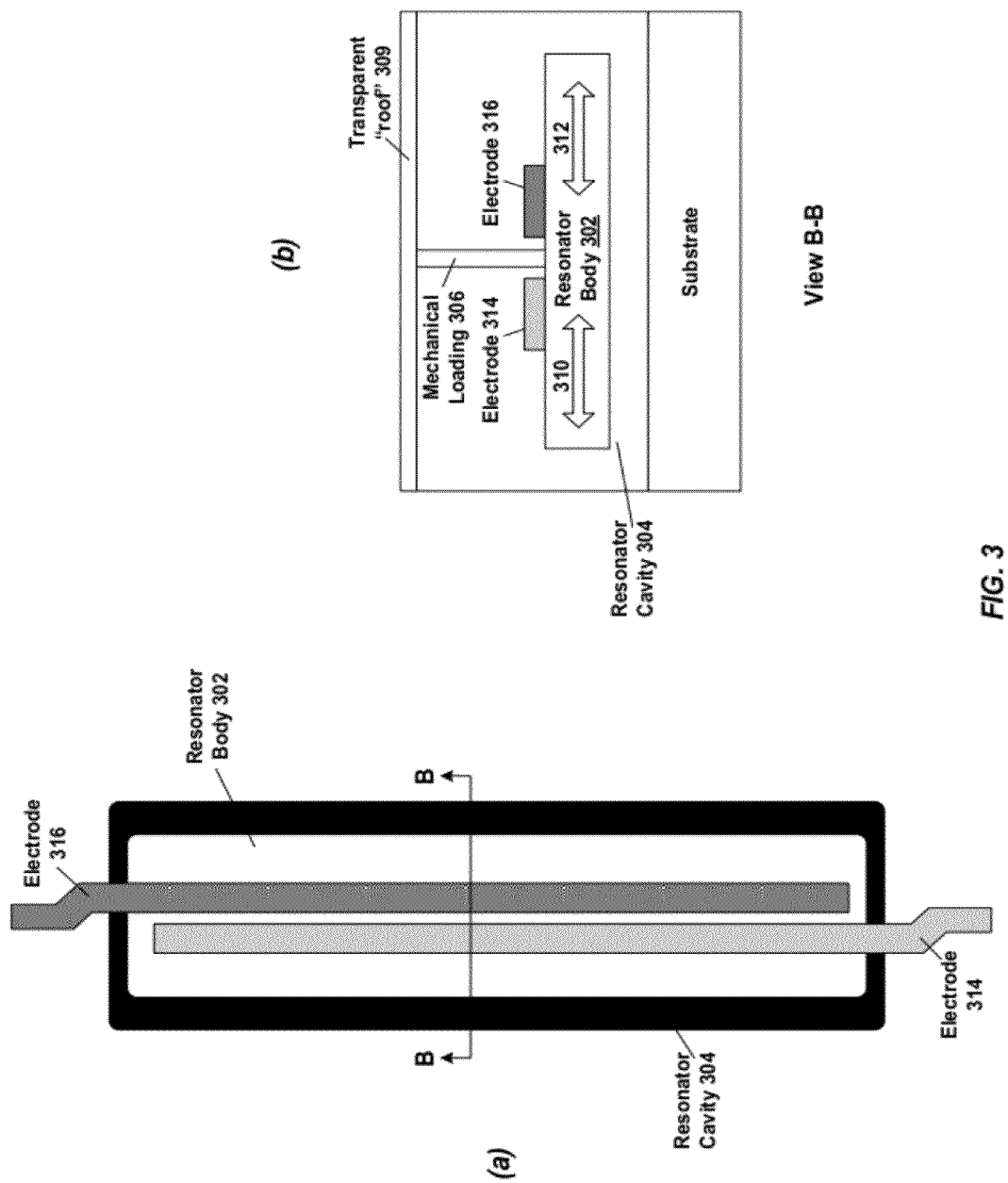
FIG. 3(a) shows another example of a top view of a resonator.
FIG. 3(b) shows an example of a cross-sectional view of the resonator of FIG. 3(a).
Figure 4:
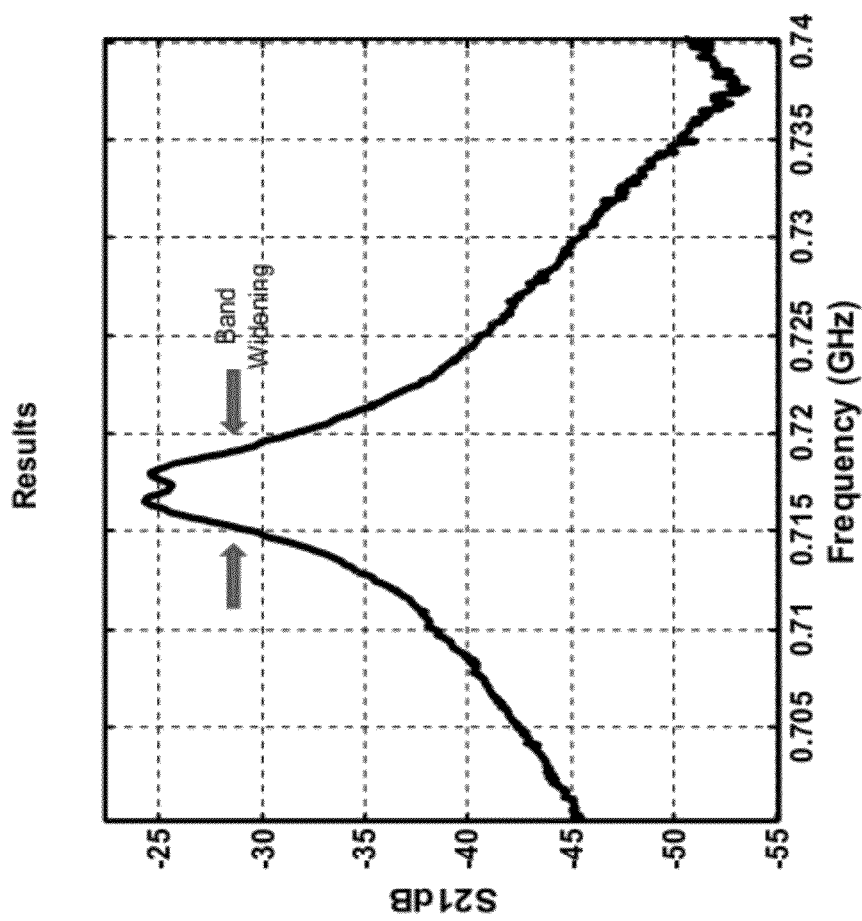
FIG. 4 shows an example of a graph illustrating the bandwidth widening associated with the resonator of FIGS. 3(a) and 3(b).

FIG. 3(a) shows another example of a top view of a resonator. FIG. 3(b) shows an example of a cross-sectional view of the resonator of FIG. 3(a). FIG. 3(a) is the top view of a resonator body 302 in a resonator cavity 304 through the transparent roof or sealing element (not shown). As shown in the cross-section B-B view of FIG. 3(b), the resonator body 302 is mechanically connected to the roof 309 of the cavity 304 using a mechanical loading element 306 that, in this implementation, is also transparent. Loading element 306 is an elongated support member that extends along the center line of the underside of resonator body 302, i.e., into the page in FIG. 3(b), and substantially parallel with electrodes 314 and 316. Again, the material from which loading element 306 is constructed may vary for different implementations. And as with the implementation described above with reference to FIGS. 1(a) and 1(b), this mechanical connection loads the resonator body in such a way that results in multiple resonance modes existing in the same resonator body (e.g., represented by arrows 310 and 312). FIG. 4 shows an example of a graph illustrating the bandwidth widening associated with the resonator of FIGS. 3(a) and 3(b).

It should be understood that many variations of the implementations described herein are contemplated. For example, the number, dimensions, and placement of the mechanical loading elements may vary. In some implementations and as described above, the loading may be achieved using a single element extending along all or a portion of the resonator body (e.g., extending into the page for the A-A and B-B views of FIGS. 1(b) and 3(b), respectively). Alternatively, loading may be achieved using multiple elements along that same axis, or even multiple axes.

Figure 5A:
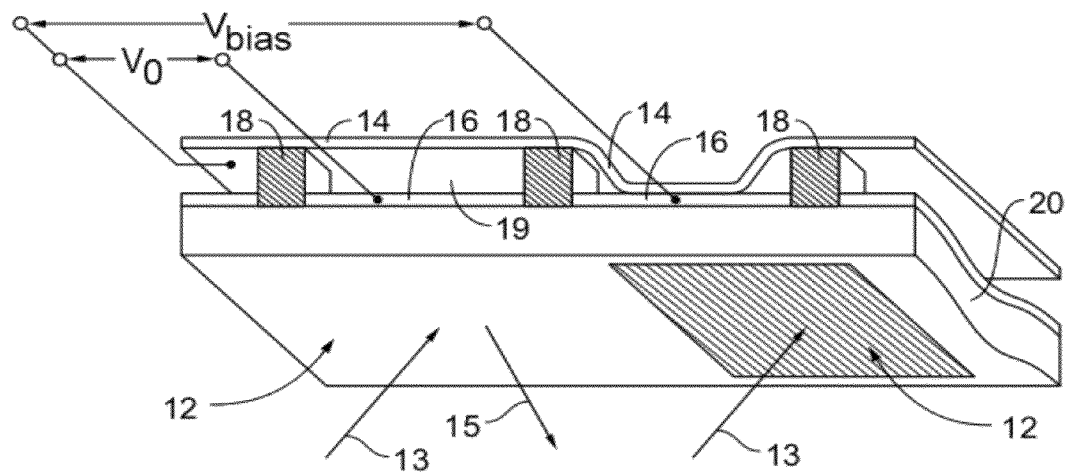
FIG. 5(a) shows an example of an isometric view depicting two adjacent pixels in a series of pixels of an interferometric modulator (IMOD) display device.

FIG. 5(a) shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 5(a) includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 5(a), the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be on the order of 1-1000 um, while the gap 19 may be on the order of <10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 5(a), with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 5(a). The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 5B:
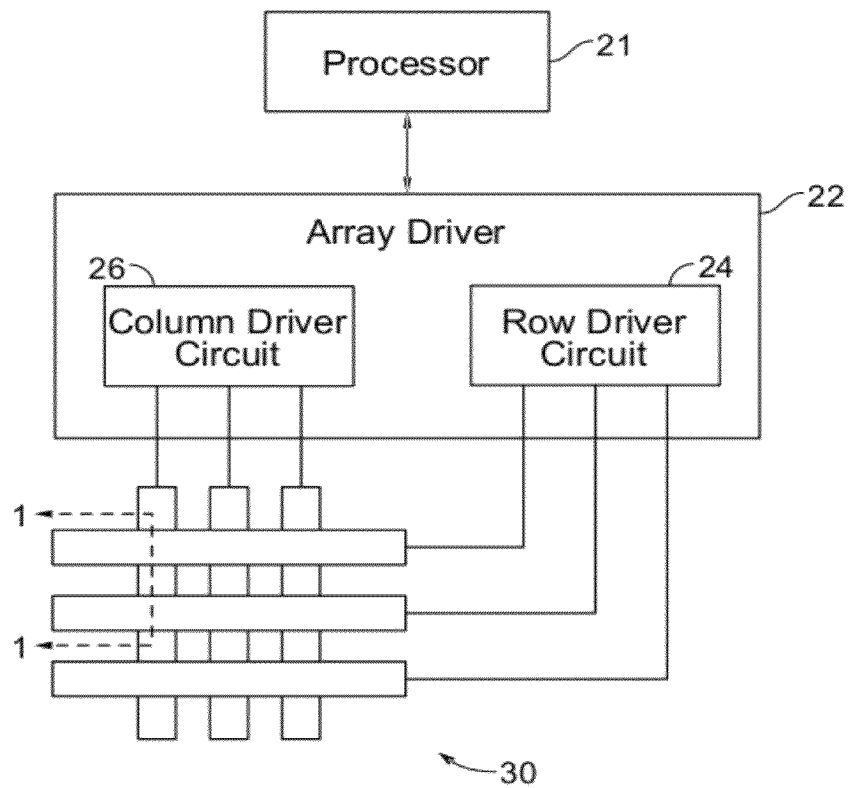
FIG. 5(b) shows an example of a system block diagram illustrating an electronic device incorporating an interferometric modulator display.

FIG. 5(b) shows an example of a system block diagram illustrating an electronic device incorporating an interferometric modulator display. The electronic device of FIG. 5(b) represents one implementation in which a resonator constructed as described herein can be incorporated. More generally, the electronic device in which such a resonator is incorporated may, for example, form part or all of any of a variety of electrical devices and electromechanical systems devices.

The electronic device of FIG. 5(b) includes a controller 21, which may include one or more general purpose single- or multi-chip microprocessors such as an ARMO, Pentium®, 8051, MIPS®, Power PC®, or ALPHA®, or special purpose microprocessors such as a digital signal processor, microcontroller, or a programmable gate array. The controller 21 may be configured to execute one or more software modules. In addition to executing an operating system, the controller 21 may be configured to execute one or more software applications, including a web browser, a telephone application, an email program, or any other software application.

The controller 21 is configured to communicate with an array driver 22. The array driver 22 can include a row driver circuit 24 and a column driver circuit 26 that provide signals to, e.g., a display array or panel 30. The cross section of the IMOD display device illustrated in FIG. 5(a) is shown by the lines 1-1 in FIG. 5(b). Although FIG. 5(b) illustrates a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 6:
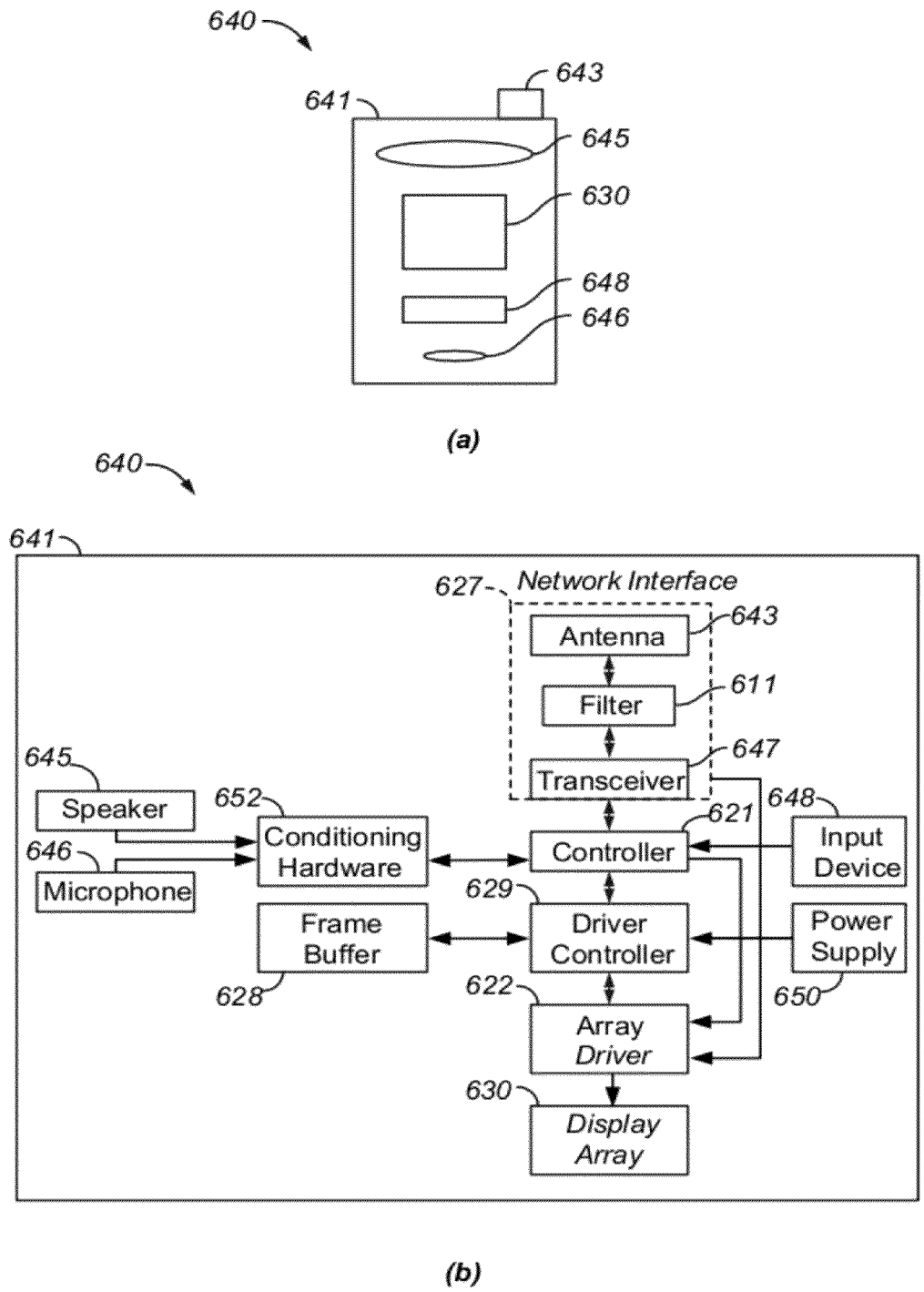
FIGS. 6(a) and 6(b) show examples of system block diagrams illustrating a display device that includes a plurality of interferometric modulators.

FIGS. 6(a) and 6(b) show examples of system block diagrams illustrating a display device that includes a plurality of interferometric modulators. Display device 640 represents one example of an electronic device as described above. The display device 640 can be, for example, a cellular or mobile telephone. However, the same components of the display device 640 or slight variations thereof are also illustrative of various types of display devices such as televisions, e-readers and portable media players.

The display device 640 includes a housing 641, a display 630, an antenna 643, a speaker 645, an input device 648, and a microphone 646. The housing 641 can be formed from any of a variety of manufacturing processes, including injection molding, and vacuum forming. In addition, the housing 641 may be made from any of a variety of materials, including, but not limited to: plastic, metal, glass, rubber, and ceramic, or a combination thereof. The housing 641 can include removable portions (not shown) that may be interchanged with other removable portions of different color, or containing different logos, pictures, or symbols.

The display 630 may be any of a variety of displays, including a bi-stable or analog display, as described herein. The display 630 also can be configured to include a flat-panel display, such as plasma, EL, OLED, STN LCD, or TFT LCD, or a non-flat-panel display, such as a CRT or other tube device. In addition, the display 630 can also include an interferometric modulator (IMOD) display.

The components of the display device 640 are schematically illustrated in FIG. 6(a). The display device 640 includes a housing 641 and can include additional components at least partially enclosed therein. For example, the display device 640 includes a network interface 627 that includes an antenna 643, which is coupled to a transceiver 647. According to some implementations, one or more CMRs implemented as described herein may be used to implement a filter 611 between antenna 643 and transceiver 647. For example, filter 611 could include a filter between antenna 643 and a low noise amplifier in the receiving circuitry of transceiver 647. Filter 611 might also include a filter between antenna 643 and a power amplifier of the transmission circuitry of transceiver 647.

The transceiver 647 is connected to a processor 621, which is connected to conditioning hardware 652. The conditioning hardware 652 may be configured to condition a signal (e.g., filter a signal). The conditioning hardware 652 is connected to a speaker 645 and a microphone 646. The processor 621 is also connected to an input device 648 and a driver controller 629. The driver controller 629 is coupled to a frame buffer 628, and to an array driver 622, which in turn is coupled to a display array 630. A power supply 650 can provide power to all components as required by the particular display device 640 design.

The network interface 627 includes the antenna 643 and the transceiver 647 so that the display device 40 can communicate with one or more devices over a network. The network interface 627 also may have some processing capabilities to relieve, e.g., data processing requirements of the processor 621. The antenna 643 can transmit and receive signals. In some implementations, the antenna 643 transmits and receives RF signals according to the IEEE 16.11 standard, including IEEE 16.11(a), (b), or (g), or the IEEE 802.11 standard, including IEEE 802.11a, b, g or n. In some other implementations, the antenna 643 transmits and receives RF signals according to the BLUETOOTH standard. In the case of a cellular telephone, the antenna 643 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 647 can pre-process the signals received from the antenna 643 so that they may be received by and further manipulated by the processor 621. The transceiver 647 also can process signals received from the processor 621 so that they may be transmitted from the display device 640 via the antenna 643. One or more CMRs designed as described herein can be incorporated in transceiver 647.

In some implementations, the transceiver 647 can be replaced by a receiver. In addition, the network interface 627 can be replaced by an image source, which can store or generate image data to be sent to the processor 621. The processor 621 can control the overall operation of the display device 640. The processor 621 receives data, such as compressed image data from the network interface 627 or an image source, and processes the data into raw image data or into a format that is readily processed into raw image data. The processor 621 can send the processed data to the driver controller 629 or to the frame buffer 628 for storage. Raw data typically refers to the information that identifies the image characteristics at each location within an image. For example, such image characteristics can include color, saturation, and gray-scale level.

The processor 621 can include a microcontroller, CPU, or logic unit to control operation of the display device 640. The conditioning hardware 652 may include amplifiers and filters for transmitting signals to the speaker 645, and for receiving signals from the microphone 646. The conditioning hardware 652 may be discrete components within the display device 640, or may be incorporated within the processor 621 or other components.

The driver controller 629 can take the raw image data generated by the processor 621 either directly from the processor 621 or from the frame buffer 628 and can re-format the raw image data appropriately for high speed transmission to the array driver 622. In some implementations, the driver controller 629 can re-format the raw image data into a data flow having a raster-like format, such that it has a time order suitable for scanning across the display array 630. Then the driver controller 629 sends the formatted information to the array driver 622. Although a driver controller 629, such as an LCD controller, is often associated with the system processor 621 as a stand-alone Integrated Circuit (IC), such controllers may be implemented in many ways. For example, controllers may be embedded in the processor 621 as hardware, embedded in the processor 621 as software, or fully integrated in hardware with the array driver 622.

The array driver 622 can receive the formatted information from the driver controller 629 and can re-format the video data into a parallel set of waveforms that are applied many times per second to the hundreds, and sometimes thousands (or more), of leads coming from the display's x-y matrix of pixels.

In some implementations, the driver controller 629, the array driver 622, and the display array 630 are appropriate for any of the types of displays described herein. For example, the driver controller 629 can be a conventional display controller or a bi-stable display controller (e.g., an IMOD controller). Additionally, the array driver 622 can be a conventional driver or a bi-stable display driver (e.g., an IMOD display driver). Moreover, the display array 630 can be a conventional display array or a bi-stable display array (e.g., a display including an array of IMODs). In some implementations, the driver controller 629 can be integrated with the array driver 622. Such an implementation is common in highly integrated systems such as cellular phones, watches and other small-area displays.

In some implementations, the input device 648 can be configured to allow, e.g., a user to control the operation of the display device 640. The input device 648 can include a keypad, such as a QWERTY keyboard or a telephone keypad, a button, a switch, a rocker, a touch-sensitive screen, or a pressure- or heat-sensitive membrane. The microphone 646 can be configured as an input device for the display device 640. In some implementations, voice commands through the microphone 646 can be used for controlling operations of the display device 640.

The power supply 650 can include a variety of energy storage devices. For example, the power supply 650 can be a rechargeable battery, such as a nickel-cadmium battery or a lithium-ion battery. The power supply 650 also can be a renewable energy source, a capacitor, or a solar cell, including a plastic solar cell or solar-cell paint. The power supply 650 also can be configured to receive power from a wall outlet.

In some implementations, control programmability resides in the driver controller 629 which can be located in several places in the electronic display system. In some other implementations, control programmability resides in the array driver 622. The above-described optimization may be implemented in any number of hardware and/or software components and in various configurations.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented may be implemented in hardware, digital electronic circuitry, computer software, firmware, including the structures disclosed in this specification and their structural equivalents thereof, or in any combination thereof. Implementations relating to the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those of ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate that relative terms such as, for example, "upper" and "lower," "top" and "bottom," and the like, are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An electromechanical resonator, comprising:
 a resonator cavity defined by a substrate, side walls, and a sealing element;
 a resonator body disposed within the resonator cavity substantially parallel to the substrate and the sealing element, the resonator body having a plurality of electrodes disposed thereon; and
 one or more mechanical loading elements mechanically connecting the resonator body to the sealing element, wherein the one or more mechanical loading elements are substantially non-coplanar with the resonator body, and wherein the one or more mechanical loading elements mechanically loads the resonator body to create a plurality of in-plane resonance modes within the resonator body.

2. The resonator of claim 1, wherein the one or more mechanical loading elements extend along a center line of the resonator body.

3. The resonator of claim 1, wherein the one or more mechanical loading elements extend along multiple parallel lines of the resonator body.

4. The resonator of claim 1, wherein the plurality of in-plane resonance modes in the resonator body includes first and second in-plane resonance modes, and wherein the plurality of electrodes are configured to induce first mechanical vibrations corresponding to the first in-plane resonance mode and second mechanical vibrations corresponding to the second in-plane resonance mode.

5. The resonator of claim 4, wherein the plurality of electrodes are further configured to induce the first and second mechanical vibrations in phase with each other in response to a first stimulus, and wherein the plurality of electrodes are further configured to induce the first and second mechanical vibrations out of phase with each other in response to a second stimulus.

6. The resonator of claim 1, wherein the resonator includes a contour mode resonator.

7. An electronic device comprising one or more of the resonators of claim 1.

8. An electromechanical resonator, comprising:
a resonator cavity defined by a substrate, side walls, and a sealing element;
a resonator body disposed within the resonator cavity and having a major surface extending substantially parallel to the substrate and the sealing element, the resonator body having an input electrode and an output electrode disposed thereon; and
a mechanical loading element located between the major surface of the resonator body and the substrate and mechanically connecting the resonator body to the substrate sealing element, wherein the mechanical loading element includes an elongated member disposed along a longitudinal axis of the resonator body and substantially along a center line of a surface of the resonator body, and wherein the mechanical loading element mechanically loads the resonator body to create two in-plane resonance modes within the resonator body.

9. The resonator of claim 8, wherein the two in-plane resonance modes in the resonator body include first and second in-plane resonance modes, and wherein the electrodes are configured to induce first mechanical vibrations corresponding to the first in-plane resonance mode and second mechanical vibrations corresponding to the second in-plane resonance mode.

10. The resonator of claim 9, wherein the electrodes are further configured to induce the first and second mechanical vibrations in phase with each other in response to a first stimulus, and wherein the electrodes are further configured to induce the first and second mechanical vibrations out of phase with each other in response to a second stimulus.

11. An electromechanical resonator, comprising:
a resonator cavity defined by a substrate, side walls, and a transparent sealing element;
a resonator body disposed within the resonator cavity substantially parallel to the substrate and the sealing element, the resonator body having an input electrode and an output electrode disposed thereon; and
a transparent mechanical loading element mechanically connecting the resonator body to the sealing element, wherein the mechanical loading element includes an elongated member disposed along a longitudinal axis of the resonator body and substantially along a center line of a surface of the resonator body, and wherein the mechanical loading element mechanically loads the resonator body to create two in-plane resonance modes within the resonator body.

12. The resonator of claim 11, wherein the two in-plane resonance modes in the resonator body include first and second in-plane resonance modes, and wherein the electrodes are configured to induce first mechanical vibrations corresponding to the first in-plane resonance mode and second mechanical vibrations corresponding to the second in-plane resonance mode.

13. The resonator of claim 12, wherein the electrodes are further configured to induce the first and second mechanical vibrations in phase with each other in response to a first stimulus, and wherein the electrodes are further configured to induce the first and second mechanical vibrations out of phase with each other in response to a second stimulus.

14. An apparatus, comprising:
a display;
a network interface including one or more electromechanical resonators, each resonator comprising:
a resonator cavity defined by a substrate, side walls, and a sealing element
a resonator body disposed within the resonator cavity substantially parallel to the substrate and the sealing element, the resonator body having a plurality of electrodes disposed thereon; and
one or more mechanical loading elements located substantially out-of-plane with the resonator body and mechanically connecting the resonator body to the sealing element, wherein the one or more mechanical loading elements mechanically loads the resonator body to create a plurality of in-plane resonance modes within the resonator body;
a processor that is configured to communicate with the display and the network interface, the processor being configured to process image data; and
a memory device that is configured to communicate with the processor.

15. The apparatus of claim 14, further comprising:
a driver circuit configured to send at least one signal to the display; and
a controller configured to send at least a portion of the image data to the driver circuit.

16. The apparatus of claim 14, further comprising:
an image source module configured to send the image data to the processor.

17. The apparatus of claim 14, wherein the image source module includes at least one of a receiver, transceiver, and transmitter.

18. The apparatus of claim 14, further comprising:
an input device configured to receive input data and to communicate the input data to the processor.

* * * * *